US012265410B2

(12) United States Patent
Jeong

(10) Patent No.: US 12,265,410 B2
(45) Date of Patent: Apr. 1, 2025

(54) VOLTAGE SUPPLY CIRCUIT WITH A VOLTAGE REGULATOR

(71) Applicant: SK hynix Inc., Icheon-si (KR)

(72) Inventor: Chan Hui Jeong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 212 days.

(21) Appl. No.: 18/076,060

(22) Filed: Dec. 6, 2022

(65) Prior Publication Data
US 2024/0004411 A1 Jan. 4, 2024

(30) Foreign Application Priority Data
Jul. 1, 2022 (KR) .................. 10-2022-0081457

(51) Int. Cl.
*G05F 1/575* (2006.01)
*G11C 5/14* (2006.01)

(52) U.S. Cl.
CPC ............. *G05F 1/575* (2013.01); *G11C 5/147* (2013.01)

(58) Field of Classification Search
CPC ... G05F 1/575; G05F 1/56; G05F 1/59; G05F 1/461; G11C 5/147
See application file for complete search history.

(56) References Cited

U.S. PATENT DOCUMENTS

| | | | | |
|---|---|---|---|---|
| 2006/0092743 A1* | 5/2006 | Choi | ............... | G11C 5/147 365/230.06 |
| 2013/0188432 A1* | 7/2013 | Sato | ............... | G11C 7/00 365/189.09 |
| 2016/0077537 A1* | 3/2016 | Enjalbert | ........... | G05F 1/575 323/280 |
| 2019/0252006 A1* | 8/2019 | Mori | ............... | G11C 11/4094 |
| 2023/0146885 A1* | 5/2023 | Kim | ............... | G11C 5/147 327/108 |

FOREIGN PATENT DOCUMENTS

| KR | 1020100098826 A | 9/2010 |
|---|---|---|
| KR | 1020120050247 A | 5/2012 |

* cited by examiner

*Primary Examiner* — Jerome Leboeuf
(74) *Attorney, Agent, or Firm* — WILLIAM PARK & ASSOCIATES LTD.

(57) ABSTRACT

The present technology relates to a voltage supply circuit, and the voltage supply circuit according to the present technology includes a signal generation circuit configured to generate an active mode enable signal according to a chip selection signal provided from an external device, and generate a standby mode enable signal using an external voltage provided from the external device, an active voltage regulator configured to receive the active mode enable signal and output an active mode operation voltage when the active mode enable signal is in a high state, and a standby voltage regulator configured to receive the active mode enable signal and the standby mode enable signal, output a standby mode operation voltage while the standby mode enable signal is in the high state, and output a voltage lower than the standby mode operation voltage when the active mode enable signal is in the high state.

14 Claims, 13 Drawing Sheets

<STB MODE>

<ACT MODE>

<STANDBY MODE>

VOLTAGE SUPPLY CIRCUIT WITH A VOLTAGE REGULATOR

CROSS-REFERENCE TO RELATED APPLICATION

The present application claims priority under 35 U.S.C. § 119(a) to Korean patent application number 10-2022-0081457 filed on Jul. 1, 2022, in the Korean Intellectual Property Office, the entire disclosure of which is incorporated by reference herein.

BACKGROUND

1. Field of Invention

The present disclosure relates to a voltage supply circuit, and more particularly, to a voltage drop-out regulator.

2. Description of Related Art

A low drop-out regulator (LDO) is a device for providing a stable voltage to an electronic device. The LDO operates by receiving an external input voltage and outputting a constant internal voltage. The LDO may be configured of a standby voltage regulator (standby regulator (STB LDO)) operating in a standby mode and an active voltage regulator (active regulator (ACT LDO)) operating in an active mode.

The standby voltage regulator (STB LDO) has a slow response, and thus an influence in the active mode is required to be minimized. When a target voltage targeted by the standby voltage regulator (STB LDO) is set low in the active mode, an operation voltage output by the active voltage regulator (ACT LDO) is applied, but a circuit might not be affected, and thus the target voltage of the standby voltage regulator (STB LDO) is required to be lowered only in the active mode.

SUMMARY

According to an embodiment of the present disclosure, a voltage supply circuit may include a signal generation circuit configured to generate an active mode enable signal according to a chip selection signal provided from an external device, and generate a standby mode enable signal using an external voltage provided from the external device, an active voltage regulator configured to receive the active mode enable signal and output an active mode operation voltage when the active mode enable signal is in a high state, and a standby voltage regulator configured to receive the active mode enable signal and the standby mode enable signal, output a standby mode operation voltage while the standby mode enable signal is in the high state, and output a voltage lower than the standby mode operation voltage when the active mode enable signal is in the high state.

According to an embodiment of the present disclosure, a voltage drop-out regulator may include a voltage comparator configured to compare a reference voltage provided from an external device and a feedback voltage provided by an output voltage controller, and output a comparison signal according to a comparison result, an input voltage controller of which power is turned on or off based on the comparison signal and an outside application voltage which is a voltage applied from the external device, and an output voltage controller connected to the input voltage controller, and configured to adjust the feedback voltage in response to an active mode enable signal of a high state generated based on a chip selection signal input from the external device, provide the adjusted feedback voltage to the voltage comparator, and provide an internal voltage to be used in a standby mode in response to the active mode enable signal of a low state and a standby mode enable signal of a high state generated using the outside application voltage.

According to an embodiment of the present disclosure, a voltage drop-out regulator may include a voltage comparator configured to compare a reference voltage provided from an external device and a feedback voltage provided by an output voltage controller, and output a comparison signal according to a comparison result, an input voltage controller configured to receive an external voltage through an external voltage terminal connected to the external device, and transmit the external voltage to an output voltage controller by turning off power when the comparison signal is in a high state and turning on the power when the comparison signal is in a low state, the output voltage controller connected to the input voltage controller and configured to provide an internal voltage to be used in a standby mode in response to a standby mode enable signal of the high state generated using the external voltage, and a comparison controller configured to control the voltage comparator to output the comparison signal of the high state in response to an active mode enable signal of the high state generated based on a chip selection signal input from the external device.

According to an embodiment of the present disclosure, a memory device may include memory cells, a voltage supply circuit including a signal generation circuit configured to generate an active mode enable signal according to a chip selection signal provided from an external device, and may generate a standby mode enable signal according to an external voltage provided from the external device, an active voltage regulator configured to receive the active mode enable signal and output an active mode operation voltage of the memory cells in an active mode in which the active mode enable signal is in a high state, and a standby voltage regulator configured to receive the active mode enable signal and the standby mode enable signal, output a standby mode operation voltage of the memory cells while the standby mode enable signal is in the high state, and output a voltage lower than the standby mode operation voltage of the memory cells when the active mode enable signal is in the high state, and having an output terminal connected to an output terminal of the active voltage regulator to receive the active mode operation voltage of the memory cells through the output terminal, and a control logic configured to control the voltage supply circuit.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as being limited to the embodiments described in the present specification or application. Further, the logic levels of the signals may be different from or the opposite of those described. For example, a signal described as having a logic "high" level may alternatively have a logic "low" level, and a signal described as having a logic "low" level may alternatively have a logic "high" level. In the description of the present disclosure, the terms "first" and "second" may be used to describe various components, but the components are not limited by the terms. The terms may be used to distinguish one component from another component. For example, a first component may be called a second component and a second component may be called a first component without departing from the scope of the present disclosure. It will be understood that when an element or layer etc., is referred to as being "on," "connected to" or "coupled to" another element or layer etc., it can be directly on, connected or coupled to the other element or layer etc., or intervening elements or layers etc., may be present. In contrast, when an element or layer etc., is referred to as being "directly on," "directly connected to" or "directly coupled to" another element or layer etc., there are no intervening elements or layers etc., present.

An embodiment of the present disclosure provides a standby voltage regulator set to have a target voltage lower than an operation voltage output by an active voltage regulator in an active mode.

The voltage supply circuit according to an embodiment may set a target voltage of the standby voltage regulator to a value lower than an operation voltage in the active mode, thereby eliminating an influence on the active mode.

Figure 1:
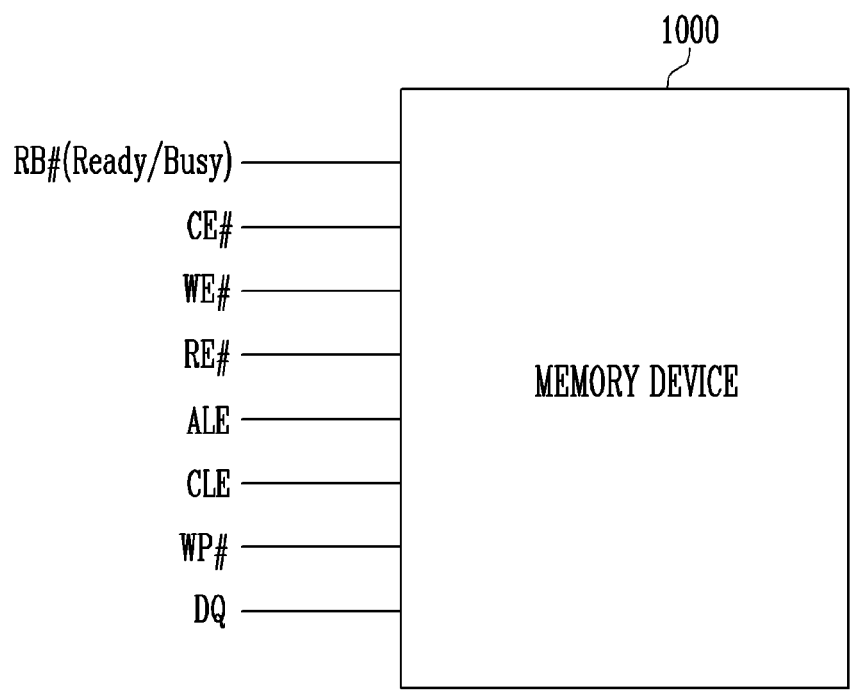
FIG. 1 is a diagram illustrating a pin configuration of a semiconductor memory device according to an embodiment of the present disclosure.

FIG. 1 is a diagram illustrating a pin configuration of a semiconductor memory device according to an embodiment of the present disclosure.

Referring to FIG. 1, a memory device 1000 may communicate with a device external to the memory device 1000 or also referred to as an external device through a plurality of input/output lines. In an embodiment, the memory device 1000 may communicate with the external device through a data input/output line DQ and control signal lines including a chip enable line CE #, a write enable line WE #, a read enable line RE#, an address latch enable line ALE, a command latch enable line CLE, a write protect line WP #, and a ready/busy line RB #.

The memory device 1000 may receive a chip selection signal from the external device through the chip enable line CE #. The chip selection signal may be a signal for selecting the memory device 1000. In an embodiment, the memory device 1000 may be selected by outputting the activated chip selection signal through the chip enable line CE #from the external device. For example, the activated chip selection signal may be a logic high. When the memory device 1000 receives the activated chip selection signal, the memory device 1000 may be in a state in which the memory device 1000 may communication with the external device. The memory device 1000 receiving a deactivated chip selection signal may be in a standby state in which the memory device 1000 does not operate. For example, the deactivated chip selection signal may be a logic low. When the memory device 1000 receives the deactivated chip selection signal, the memory device 1000 may be in a state in which the memory device 1000 might not communication with the external device.

The memory device 1000 may receive a write enable signal through the write enable line WE #. The write enable signal may be toggled when a command and an address are received by the memory device 1000. In an embodiment, the command and the address may be input to the memory device 1000 when the write enable signal is changed from a logic high to a logic low.

The memory device 1000 may receive a read enable signal from the external device through the read enable line RE #. The read enable signal may be toggled when data is output to the external device. In an embodiment, the data may be output to the external device when the read enable signal is changed from a logic high to a logic low.

The memory device 1000 may receive an address latch enable signal from the external device through the address latch enable line CLE. The address latch enable signal may be a signal for inputting the address. In an embodiment, the address latch enable signal may be a logic high while the address is input to the memory device 1000.

The memory device 1000 may receive a command latch enable signal from the external device through the command latch enable line ALE. The command latch enable signal may be a signal for inputting the command. In an embodiment, the command latch enable signal may be a logic high while the command is input to the memory device 1000.

The memory device 1000 may receive a write protect signal from the external device through the write protect line WP #. The write protect signal may be a signal for deactivating program and erase operations of the memory device 1000.

The memory device 1000 may receive the command, the address, and the data from the external device through the data input/output line DQ. The memory device 1000 may output the data to the external device through the data input/output line DQ. In an embodiment, the data input/output line DQ may include 8 lines to transmit and receive 8 bits of data, and each data input/output line DQ may transmit and receive 1 bit of data. In another embodiment, the number of data input/output lines DQ may be extended to 16 or 32 or more.

The memory device 1000 may output an outside state signal of a ready state or a busy state to the external device through the ready/busy line RB #. The outside state signal of the ready state may be a state in which the command, the address, or the data may be input from the external device. The outside state signal of the ready state may be a logic high. The outside state signal of the busy state may be a state in which the command, the address, or the data might not be input from the external device. The outside state signal of the busy state may be a logic low. That is, when the memory device 1000 is in the ready state, the memory device 1000 may output a signal of an inverted low state through the ready/busy line RB #. Similarly, when the memory device 1000 is in the busy state, the memory device 1000 may output a signal of an inverted high state through the ready/busy line RB #. In an embodiment, the external device, for example, may be a memory controller that controls the memory device 1000. In an embodiment, the external device, for example, may be a host. In an embodiment, the external device, for example may be any device external to the memory device 1000.

Figure 2:
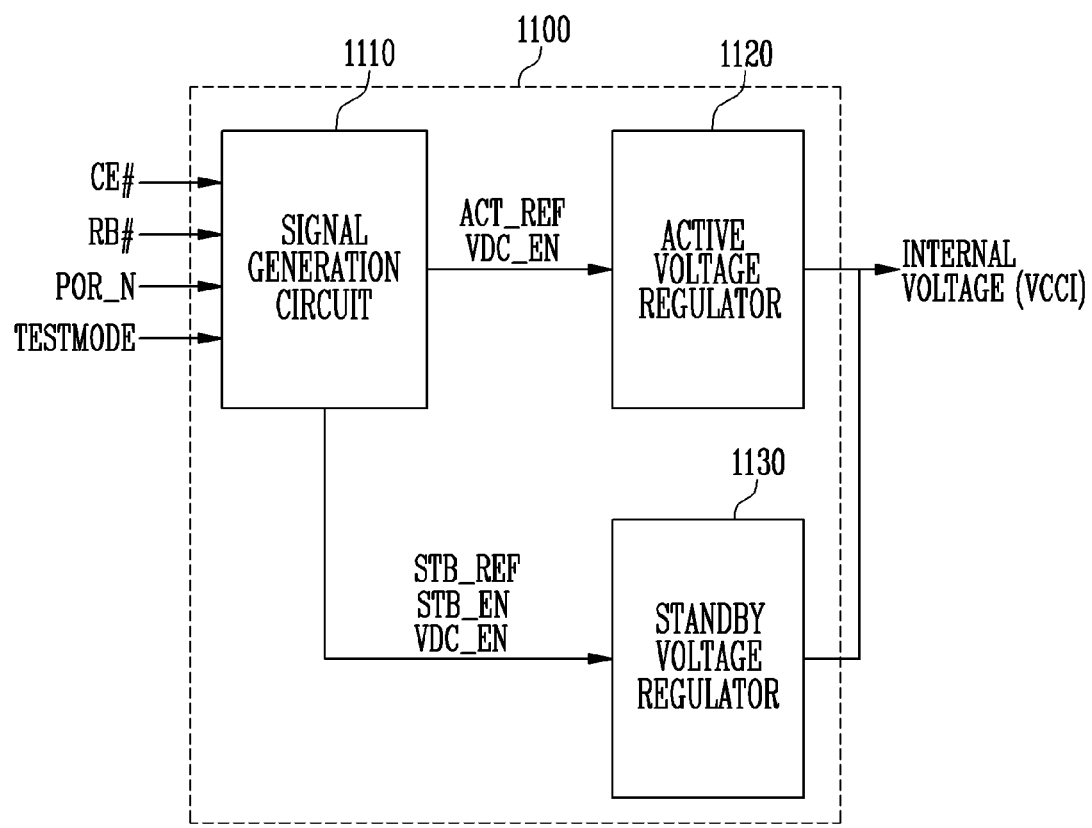
FIG. 2 is a diagram illustrating a voltage supply circuit according to an embodiment of the present disclosure.

FIG. 2 is a diagram illustrating a voltage supply circuit according to an embodiment of the present disclosure.

Referring to FIG. 2, the voltage supply circuit 1100 for providing an internal voltage of a memory device is shown.

The voltage supply circuit 1100 may be a circuit providing a voltage to be used inside the memory device. The voltage supply circuit 1100 may include a signal generation circuit 1110, an active voltage regulator 1120, and a standby voltage regulator 1130. The signal generation circuit 1110 may be a circuit generating a signal for controlling the active voltage regulator 1120 and the standby voltage regulator 1130 based on a signal input from the external device. In an embodiment, a device external to the voltage supply circuit 1100 and semiconductor memory device 1000 may be an external device. The active voltage regulator 1120 may be a regulator for outputting an operation voltage to be used in an active mode. The standby voltage regulator 1130 may be a regulator for outputting an operation voltage to be used in a standby mode. A voltage to be output by the active voltage regulator and the standby voltage regulator may be a target voltage of each regulator. In addition, an operation voltage in the active mode and an operation voltage in the standby mode may be the same value.

The signal generation circuit 1110 may generate an active mode enable signal VDC_EN and a standby mode enable signal STB_EN according to a chip enable line CE #, a ready/busy signal from a Ready/busy line RB #, a power of reset inversion signal POR_N, and a test mode signal TESTMODE. A method of generating the signal by the signal generation circuit 1110 will be described in detail description of FIG. 3.

The signal generation circuit 1110 may generate an active mode reference voltage ACT_REF and an active mode enable signal VDC_EN for controlling the active voltage regulator. The active mode reference voltage ACT_REF may be a reference voltage input to the active voltage regulator. In addition, the active mode enable signal VDC_EN may be a signal indicating the active mode. When the memory device enters the active mode, the signal generation circuit 1110 may provide the active mode reference voltage ACT_REF and the active mode enable signal VDC_EN of a high state to the active voltage regulator 1120 to control the active voltage regulator 1120.

The signal generation circuit 1110 may generate a standby mode reference voltage STB_REF, a standby mode enable signal STB_EN, and an active mode enable signal VDC_EN for controlling the standby voltage regulator. The standby mode reference voltage STB_REF may be a reference voltage input to the standby voltage regulator in the standby mode. The standby mode enable signal STB_EN may be a signal indicating the standby mode. When the memory device enters the standby mode, the signal generation circuit 1110 may provide the standby mode reference voltage STB_REF and the standby mode enable signal STB_EN of the high state to the standby voltage regulator 1130 to control the standby voltage regulator 1130. In addition, when the memory device enters the active mode, the signal generation circuit 1110 may provide the active mode enable signal VDC_EN of the high state to the standby voltage regulator 1130 to control the standby voltage regulator 1130.

The active voltage regulator 1120 and the standby voltage regulator 1130 may generate an operation voltage to be used in the memory device. When the active mode enable signal VDC_EN of the high state is input, the active voltage regulator 1120 may recognize that the memory device 1000 is in the active mode and provide an operation voltage to be used in the active mode. When the standby mode enable signal of the high state is input, the standby voltage regulator 1130 may recognize that the memory device 1000 is in the standby mode and provide an operation voltage to be used in the standby mode. In an embodiment, the active voltage regulator 1120 may output an internal voltage (VCCI). In an embodiment, the standby voltage regulator 1130 may output an internal voltage (VCCI).

Figure 3:
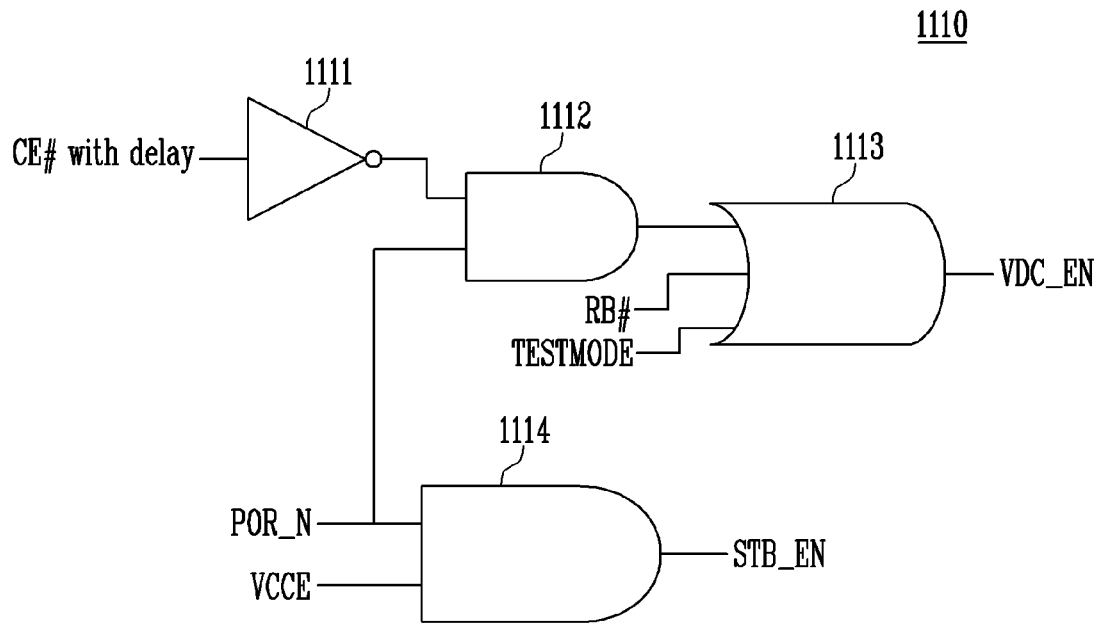
FIG. 3 is a diagram illustrating an embodiment of a signal generation circuit of FIG. 2.

FIG. 3 is a diagram illustrating an embodiment of the signal generation circuit 1110 of FIG. 2.

Referring to FIG. 3, a process of generating a signal provided to a regulator by the signal generation circuit 1110 based on a signal input from the external device is shown.

The signal generation circuit 1110 may be configured as a logic circuit including an inverter 1111, a first AND gate 1112, an OR gate 1113, and a second AND gate 1114.

When the chip selection signal indicating that the memory device is selected is input from the external device through the chip enable line CE #, the chip selection signal from the chip enable line CE#may be inverted through the inverter 1111 and provided to the first AND gate 1112. A power of reset inversion signal POR_N may be provided to the first AND gate 1112. A power of reset signal (POR) may be a signal indicating a power up or power down period of the memory device.

Therefore, the power of reset inversion signal POR_N may be a signal indicating all periods except for the power up or power down period of the memory device. The first AND gate 1112 may provide an output of the high state to the OR gate 1113 when the memory device is selected and the memory device is not in the power up or power down period. The first AND gate 1112 may provide an output of a low state to the OR gate 1113 when the memory device is not selected or the memory device is in the power up or power down period.

The OR gate may output the active mode enable signal VDC_EN of the high state when a signal input from the first AND gate 1112 is in the high state, the inverted ready/busy signal according to ready/busy line RB #of the high state indicating that the memory device is in operation is input, or the test mode signal TESTMODE indicating that the memory device is in a test mode is input. The OR gate may output the active mode enable signal VDC_EN of the low state when the signal input from the first AND gate 1112 is in the low state, the inverted ready/busy signal according to ready/busy line RB #of the low state indicating that the memory device is in the ready state is input, or the memory device does not enter the test mode.

When the inverted ready/busy signal is in the high state, the inverted ready/busy signal may mean that the memory device is in operation. When the inverted ready/busy signal is in the low state, the inverted ready/busy signal may mean that the memory device is in the ready state. The test mode signal TESTMODE may be a signal indicating that the memory device enters the test mode. The signal generation circuit 1110 may simultaneously provide the generated active mode enable signal VDC_EN to the active voltage regulator and the standby voltage regulator. The words "simultaneous" and "simultaneously" as used herein with respect to processes mean that the processes take place on overlapping intervals of time. For example, if a first process takes place over a first interval of time and a second process takes place simultaneously over a second interval of time, then the first and second intervals of time at least partially overlap each other such that there exists a time at which the first and second processes are both taking place.

The second AND gate 1114 may receive the power of reset inversion signal POR_N and the external voltage application signal VCCE. The external voltage application signal VCCE may be a signal indicating that an external voltage is applied. The second AND gate 1114 may output the standby mode enable signal STB_EN of the high state to the standby voltage regulator when the power of reset inversion signal PON_N is in the high state and the external voltage application signal VCCE is in the high state. The standby mode enable signal STB_EN may be in the high state in all the period except for the power up or power down period.

Figure 4:
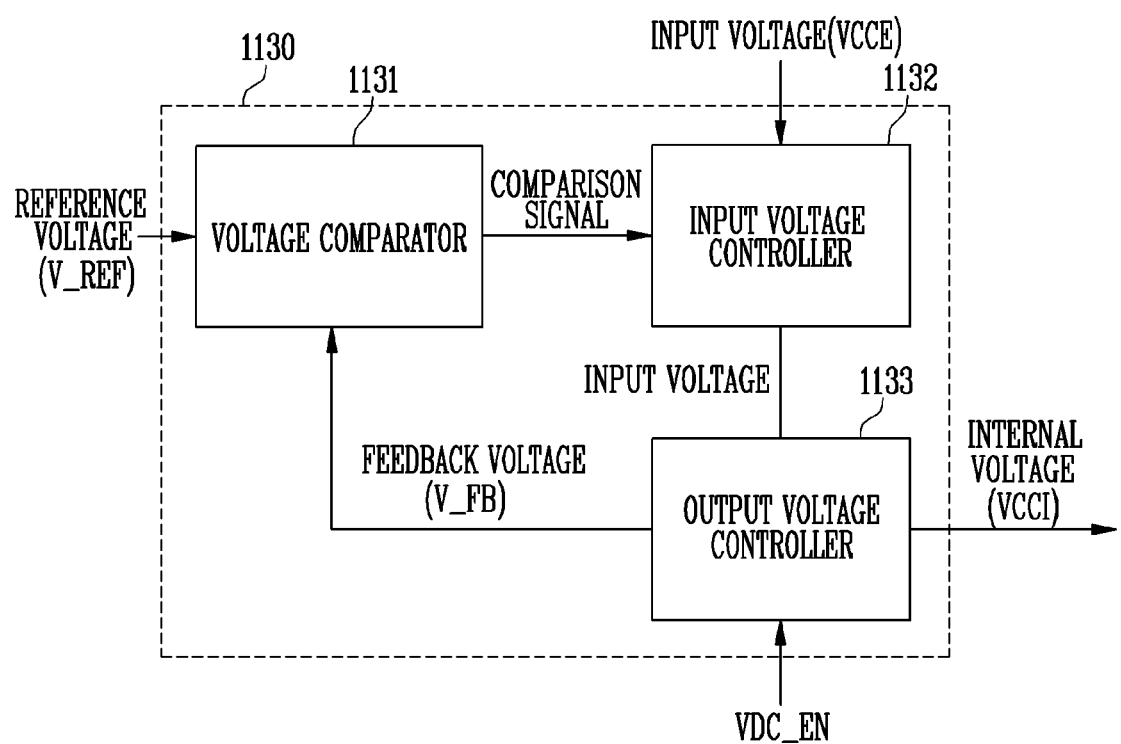
FIG. 4 is a diagram illustrating a structure of a standby voltage regulator according to an embodiment of the present disclosure.

FIG. 4 is a diagram illustrating a structure of a standby voltage regulator according to an embodiment of the present disclosure.

Referring to FIG. 4, the standby voltage regulator 1130 according to an embodiment may include a voltage comparator 1131, an input voltage controller 1132, and an output voltage controller 1133.

The voltage comparator 1131 may receive a reference voltage V_REF and a feedback voltage V_FB, and output a comparison signal according to a comparison result to the input voltage controller 1132. The reference voltage may be a preset value. The feedback voltage V_FB may be a voltage provided by the output voltage controller 1133. The feedback voltage V_FB may be varied in the output voltage controller 1133. The word "preset" as used herein with respect to a parameter, such as a preset value, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The voltage comparator 1131 may compare the reference voltage V_REF and the feedback voltage V_FB, and then may provide the comparison signal of the high state to the input voltage controller 1132 when the feedback voltage V_FB is greater than the reference voltage V_REF. In addition, the voltage comparator 1131 may compare the reference voltage V_REF and the feedback voltage V_FB, and then may provide the comparison signal of the low state to the input voltage controller 1132 when the feedback voltage V_FB is less than or equal to the reference voltage V_REF. The comparison signal of the high state may be a signal for turning off power of the input voltage controller 1132. The comparison signal of the low state may be a signal for turning on the power of the input voltage controller 1132. In addition, the comparison signal of the high state may be output as the same voltage value as the external input voltage VCCE.

The input voltage controller 1132 may receive the input voltage VCCE from the external device and may receive the comparison signal from the voltage comparator 1131. The input voltage controller 1132 may provide the received input voltage VCCE to the output voltage controller 1133 in a state in which power is turned on. When the input voltage controller 1132 receives the input voltage VCCE and the comparison signal is in the high state, the input voltage controller 1132 might not provide the input voltage VCCE to the output voltage controller 1133 because the power is turned off. When the input voltage controller 1132 receives the input voltage VCCE and the comparison signal is in the low state, the input voltage controller 1132 may provide the input voltage VCCE to the output voltage controller 1133 because the power is turned on. In a process of providing the input voltage VCCE, a voltage lower than the input voltage VCCE may be provided to the output voltage controller 1133 due to a voltage drop-out of the input voltage controller 1132 itself.

The output voltage controller 1133 may be connected to the input voltage controller 1132 to receive the external input voltage VCCE provided by the input voltage controller 1132. The output voltage controller 1133 may control the feedback voltage in response to the active mode enable signal VDC_EN of the high state provided by the signal generation circuit. The output voltage controller 1133 may adjust the feedback voltage and provide the feedback voltage to the voltage comparator 1131 again. The output voltage controller 1133 may determine an internal voltage to be used in the memory device and output the determined internal voltage VCCI. This process may be repeated.

When the active mode enable signal VDC_EN of the high state is input, the output voltage controller 1133 may increase a value of the feedback voltage V_FB provided to the voltage comparator 1131. When the increased feedback voltage V_FB is input to the voltage comparator 1131, the voltage comparator 1131 may provide the comparison signal of the high state to the input voltage controller 1132. Power of the input voltage controller 1132 receiving the comparison signal of the high state may be turned off. Through the process described above, the output voltage controller 1133 may release the connection with the input voltage controller 1132.

Figure 5:
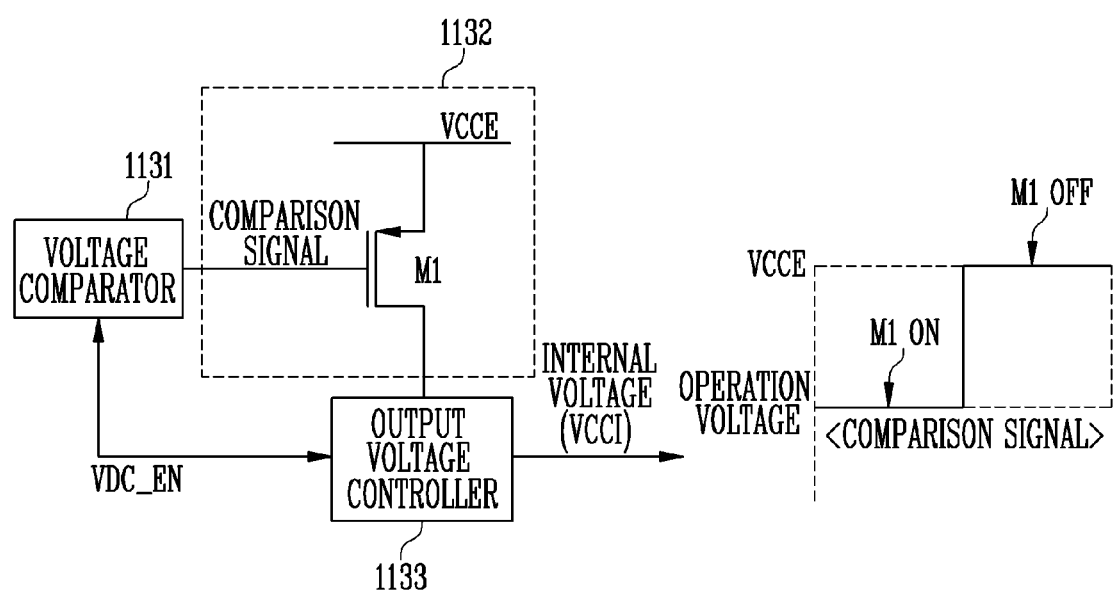
FIG. 5 is a diagram illustrating an example of a structure and an operation of one configuration of a regulator of FIG. 4.

FIG. 5 is a diagram illustrating an example of a structure and an operation of one configuration of a regulator of FIG. 4.

Referring to FIG. 5, a structure and an operation of an embodiment of the input voltage controller 1132 of FIG. 4 are shown.

The signal generation circuit may provide the active mode enable signal VDC_EN of the high state to the voltage comparator 1131 or the output voltage controller 1133. The input voltage controller 1132 may be configured of a first transistor M1. The first transistor may be a P-MOS transistor having a source terminal connected to an external input voltage (VCCE) terminal, a gate terminal connected to a comparison signal output terminal, and a drain terminal connected to the output voltage controller 1133.

In an embodiment, the comparison signal may be a signal of the high state. The comparison signal of the high state may mean a voltage that turns off power of the first transistor M1. That is, when the comparison signal is in the high state, the comparison signal may be a voltage applied so that the first transistor M1 might not operate because a difference between a gate voltage and the source voltage VCCE is small. When the comparison signal is high, a voltage value equal to the external input voltage VCCE may be provided to the gate of the first transistor M1. In this case, since the difference between the gate and source voltages of the first transistor M1 becomes 0, the power of the first transistor M1 may be turned off. Conversely, when the comparison signal is in the low state, an output signal may be a transistor operation voltage for operating the first transistor M1. The transistor operation voltage may be a preset value. The transistor operation voltage may be varied. Therefore, the first transistor M1 may operate according to a difference between the source voltage and the transistor operation voltage.

When the power of the first transistor M1 is turned on because the active mode enable signal VDC_EN is in the low state, the first transistor M1 may be connected to the output voltage controller 1133. In this case, a current may flow to the output voltage controller 1133 through the first transistor M1. A difference between the external input voltage VCCE and a voltage drop-out across the first transistor M1 may be provided to the output voltage controller. That is, the output voltage controller 1133 may provide a difference between the external input voltage VCCE and the voltage applied to the input voltage controller 1132 as the internal voltage VCCI.

When the power of the first transistor M1 is turned off because the active mode enable signal VDC_EN is in the high state, the connection with the output voltage controller 1133 may be disconnected. In this case, current might not flow through the first transistor M1. However, an internal voltage VCCI providing terminal of the output voltage controller 1133 may be connected to an internal voltage providing terminal of the active voltage regulator. Therefore, an internal voltage provided by the active voltage regulator may be applied to the output voltage controller 1133.

Figure 6:
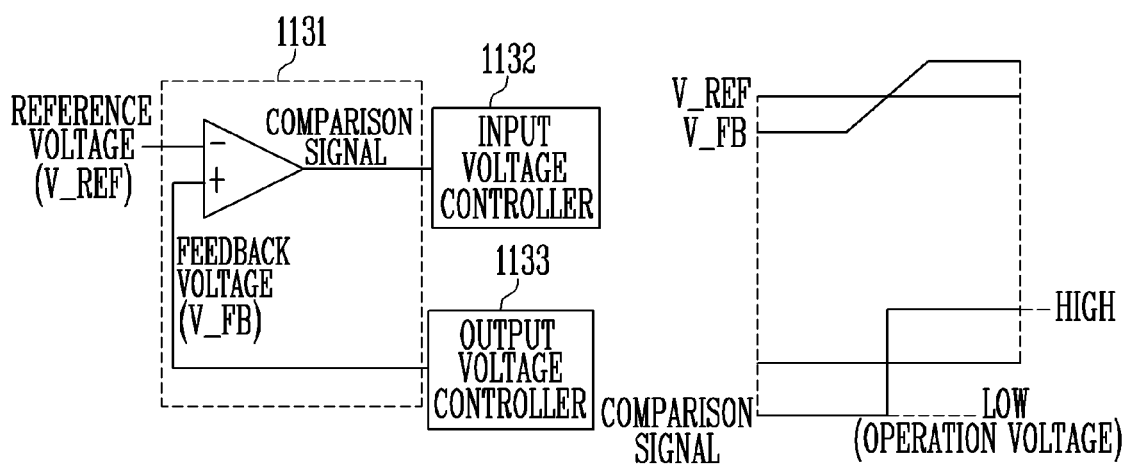
FIG. 6 is a diagram illustrating an example of a structure and an operation of another configuration of the regulator of FIG. 4.

FIG. 6 is a diagram illustrating an example of a structure and an operation of another configuration of the regulator of FIG. 4.

Referring to FIG. 6, a voltage comparator 1131 including a comparator of the reference voltage V_REF and the feedback voltage V_FB is shown.

The voltage comparator 1131 may include an operational amplifier to which the reference voltage V_REF is applied to a non-inverting input terminal and the feedback voltage V_FB is input to an inverting input terminal. The reference voltage V_REF may be a preset value. The feedback voltage V_FB may be a voltage controlled by the output voltage controller 1133 and provided by the output voltage controller 1133. When the feedback voltage V_FB applied to the inverting input terminal is greater than the reference voltage V_REF, the operational amplifier may provide the comparison signal of the high state to the input voltage controller 1132. When the feedback voltage V_FB is less than or equal to the reference voltage V_REF, the operational amplifier may provide the comparison signal of the low state to the input voltage controller 1132. The comparison signal of the high state may be a signal for turning off power of the input voltage controller. The comparison signal of the low state may be a signal for turning on the power of the input voltage controller. The comparison signal may mean a voltage value.

Figure 7:
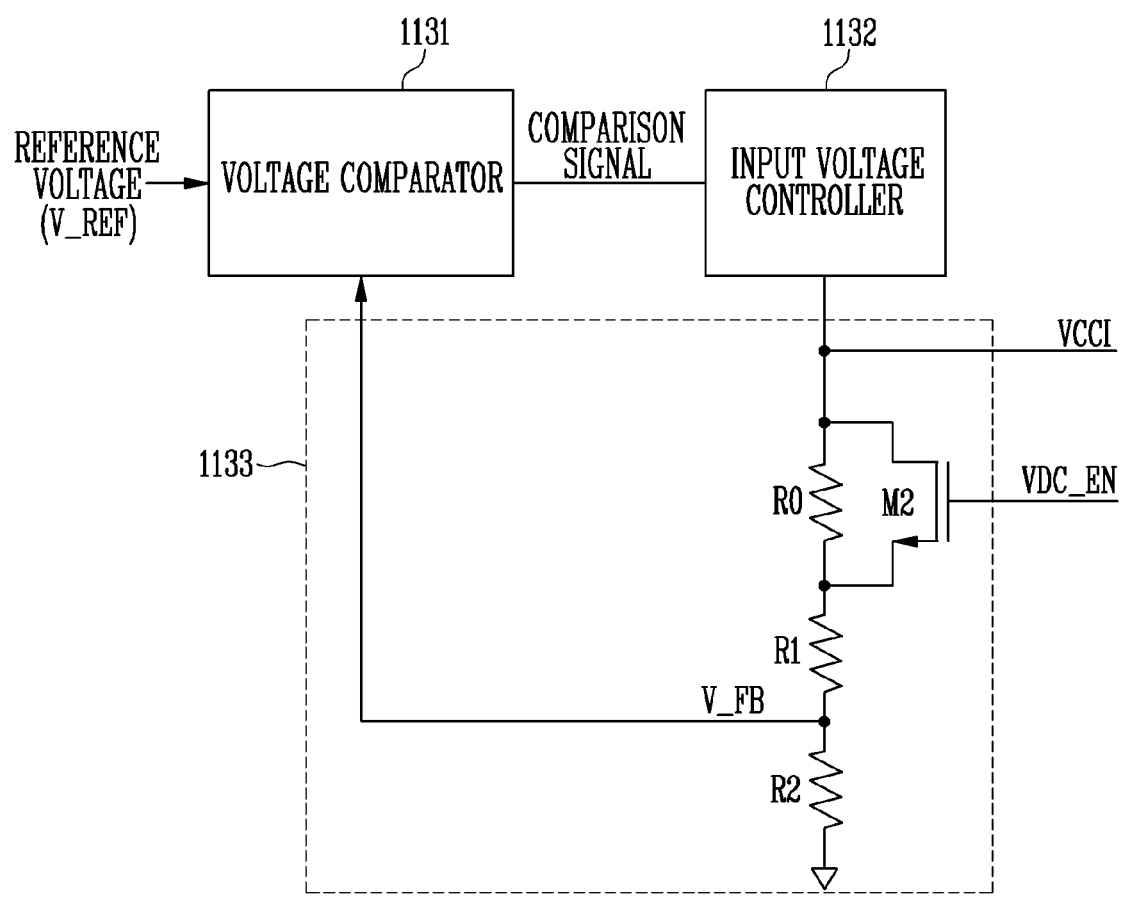
FIG. 7 is a diagram illustrating an example of a structure and an operation of another configuration of the regulator of FIG. 4.

FIG. 7 is a diagram illustrating an example of a structure and an operation of another configuration of the regulator of FIG. 4.

Referring to FIG. 7, an embodiment of the output voltage controller 1133 is shown.

The output voltage controller 1133 according to an embodiment may include an output terminal providing the internal voltage VCCI, a plurality of resistors, and a second transistor M2.

The second transistor M2 may have a drain terminal connected to an internal voltage VCCI output terminal, a source terminal connected between a feedback voltage terminal to which the feedback voltage V_FB is applied, and a first resistor R0, and a gate terminal connected to a terminal from which the active mode enable signal VDC_EN is output. That is, the gate terminal of the second transistor may be connected to the signal generation circuit.

The first resistor R0 may be connected to the second transistor M2 in parallel. That is, the first resistor R0 may be connected in series between the internal voltage VCCI output terminal and the second resistor R1. The second resistor R1 may be connected between the first resistor R0 and the feedback voltage terminal for applying the feedback voltage V_FB. A third resistor R2 may be connected between a ground terminal and the feedback voltage terminal. Although the first to third resistors are described for convenience of description, the number of resistors may vary according to design.

When a voltage is applied to the internal voltage VCCI output terminal, voltage distribution may occur according to values of the first to third resistors. That is, a sum of a voltage applied to the first resistor R0, a voltage applied to the second resistor R1, and a voltage applied to the third resistor R2 may be the internal voltage VCCI. A magnitude of the voltage applied to each resistor may vary for each resistance value. Therefore, when a resistance value is decreased by using a variable resistor or through design, the magnitude of the voltage applied to the feedback voltage terminal may be increased.

The output voltage controller 1133 may determine the voltage applied from the ground terminal to the third resistor R2 as the feedback voltage and provide the feedback voltage to the voltage comparator 1131. The voltage comparator 1131 may compare the received feedback voltage V_FB with the reference voltage V_REF and output the comparison signal to the input voltage controller 1132.

The second transistor M2 may operate as a switch. That is, when the active mode enable signal VDC_EN is applied, power of the second transistor M2 may be turned on. In this case, a current may flow through the second transistor M2 through the internal voltage VCCI output terminal. An internal resistance value of the second transistor M2 may be less than that of the first resistor R0.

Figure 8:
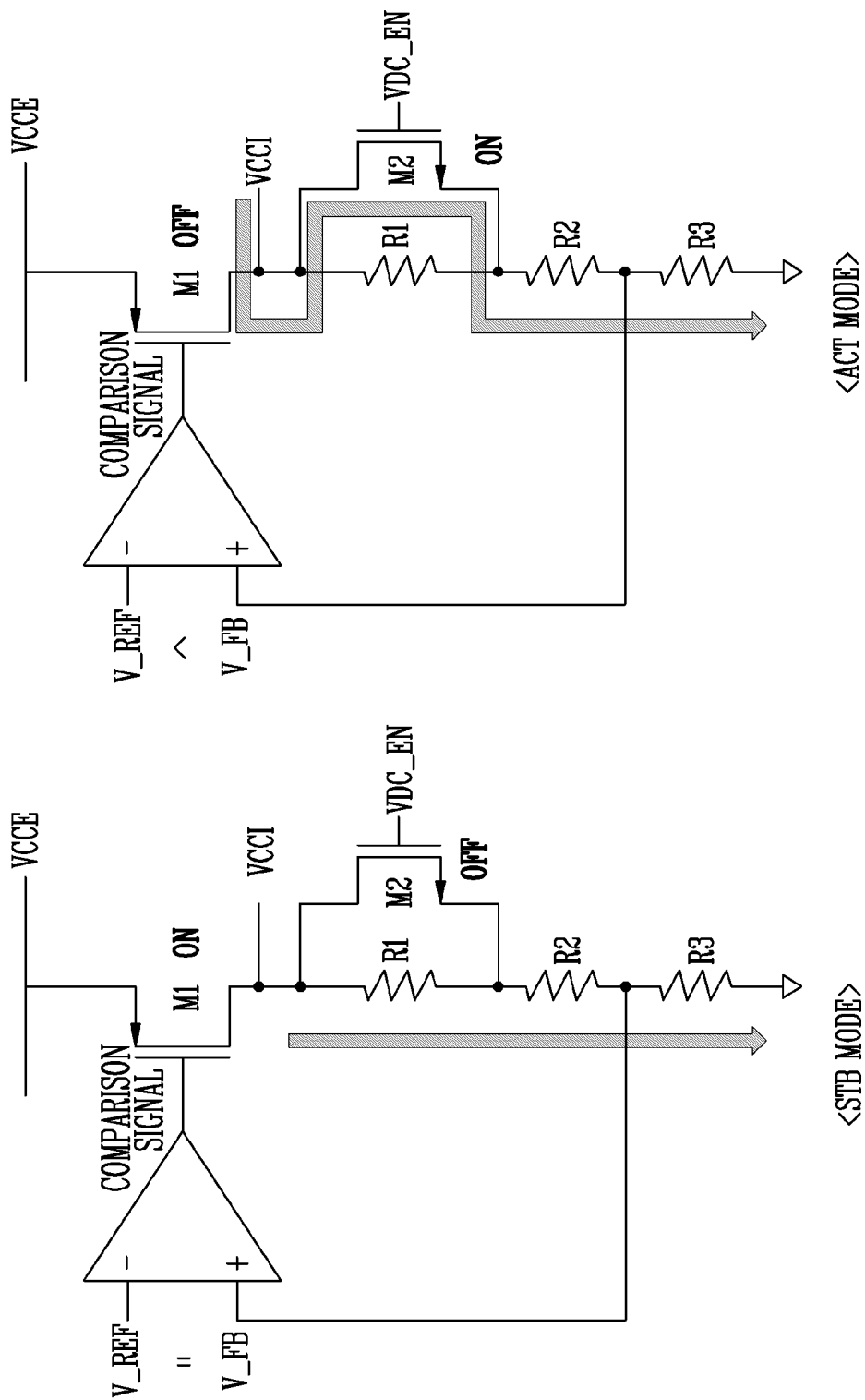
FIG. 8 is a diagram illustrating an operation process of a standby voltage regulator according to an embodiment of the present disclosure.

FIG. 8 is a diagram illustrating an operation process of a standby voltage regulator according to an embodiment of the present disclosure.

Referring to FIG. 8, the standby voltage regulator in which all configurations of FIGS. 5 to 7 are included and an operation process thereof are shown.

A standby mode STB_MODE may mean a state in which the standby mode enable signal STB_EN is in the high state and the active mode enable signal VDC_EN is in the low state. When the signal generation circuit provides the standby mode enable signal STB_EN of the high state and the active mode enable signal VDC_EN of the low state to the standby voltage regulator, the signal generation circuit may operates as the regulator shown on the left.

In the standby mode, the reference voltage V_REF and the feedback voltage V_FB input to the voltage comparator may have the same value. In this case, the comparator may provide the comparison signal of the low state to the first transistor M1. The first transistor M1 may operate because the power is turned on based on the external input voltage VCCE and the comparison signal of the low state. In this case, a voltage excluding a voltage drop-out across the first transistor M1 from the external input voltage VCCE may be provided as the internal voltage. The internal voltage provided at this time may be a second internal voltage. The second internal voltage may be an internal voltage output by the standby voltage regulator in the standby mode.

The second transistor M2 might not operate because the active mode enable signal VDC_EN is in the low state. An operation voltage provided by the standby voltage regulator may be distributed and applied according to values of the first resistor R1, the second resistor R2, and the third resistor R3. The voltage applied to the third resistor R3 may be input to the comparator as the feedback voltage V_FB. At this time, the feedback voltage V_FB may have the same value as the reference voltage V_REF. Since the feedback voltage V_FB does not change, the comparison signal might not change either. Through the process described above, the standby voltage regulator may output a constant internal voltage in the standby mode. The constant internal voltage provided at this time may be a standby mode operation voltage.

The active mode ACT_MODE may mean that both of the standby mode enable signal STB_EN and the active mode enable signal VDC_EN are in the high state. In the active mode, the reference voltage V_REF is less than the feedback voltage V_FB input to the voltage comparator. When the signal generation circuit provides the standby mode enable signal STB_EN of the high state and the active mode enable signal VDC_EN of the high state to the standby voltage regulator and provide the active mode enable signal VDC_EN of the high state to the active voltage regulator, the standby mode regulator may operate as the regulator shown on the right.

In the active mode ACT_MODE, the active voltage regulator may output an operation voltage of the memory device in the active mode. An active mode operation voltage may be an internal voltage provided by the active voltage regulator to the memory device or memory cells in the active mode. An internal voltage output terminal of the active voltage regulator and an internal voltage output terminal of the standby voltage regulator may be connected to each other. Therefore, a voltage applied to the internal voltage output terminal of the standby voltage regulator in the active mode may be the same voltage as the operation voltage output by the active voltage regulator. In addition, the operation voltage may be maintained to be constant.

When the active mode enable signal VDC_EN is input to the gate terminal of the second transistor M2 in a situation where the operation voltage is applied to the standby voltage regulator, power of the second transistor M2 may be turned on. The second transistor M2 may operate as a switch. An internal resistance of the second transistor M2 may have a resistance value lower than that of the first resistor R1. Therefore, when the power of the second transistor M2 is turned on, a current may flow through the internal voltage output terminal of the standby voltage regulator to the ground terminal through the second transistor M2. In this case, in a state in which a voltage applied to the internal voltage output terminal of the standby voltage regulator is constant as the active mode operation voltage, the voltage applied to the second transistor M2 may be decreased compared to that in the standby mode. Therefore, the feedback voltage V_FB applied to the third resistor R3 may be increased compared to that in the standby mode. When the increased feedback voltage V_FB is input to the comparator, the input voltage controller may provide the comparison signal of the high state to the first transistor M1. When the first transistor M1 receives the comparison signal of the high state, the power may be turned off. By turning off the power of the first transistor M1 through the process described above, the standby voltage regulator may operate so as not to affect in the active mode.

Figure 9:
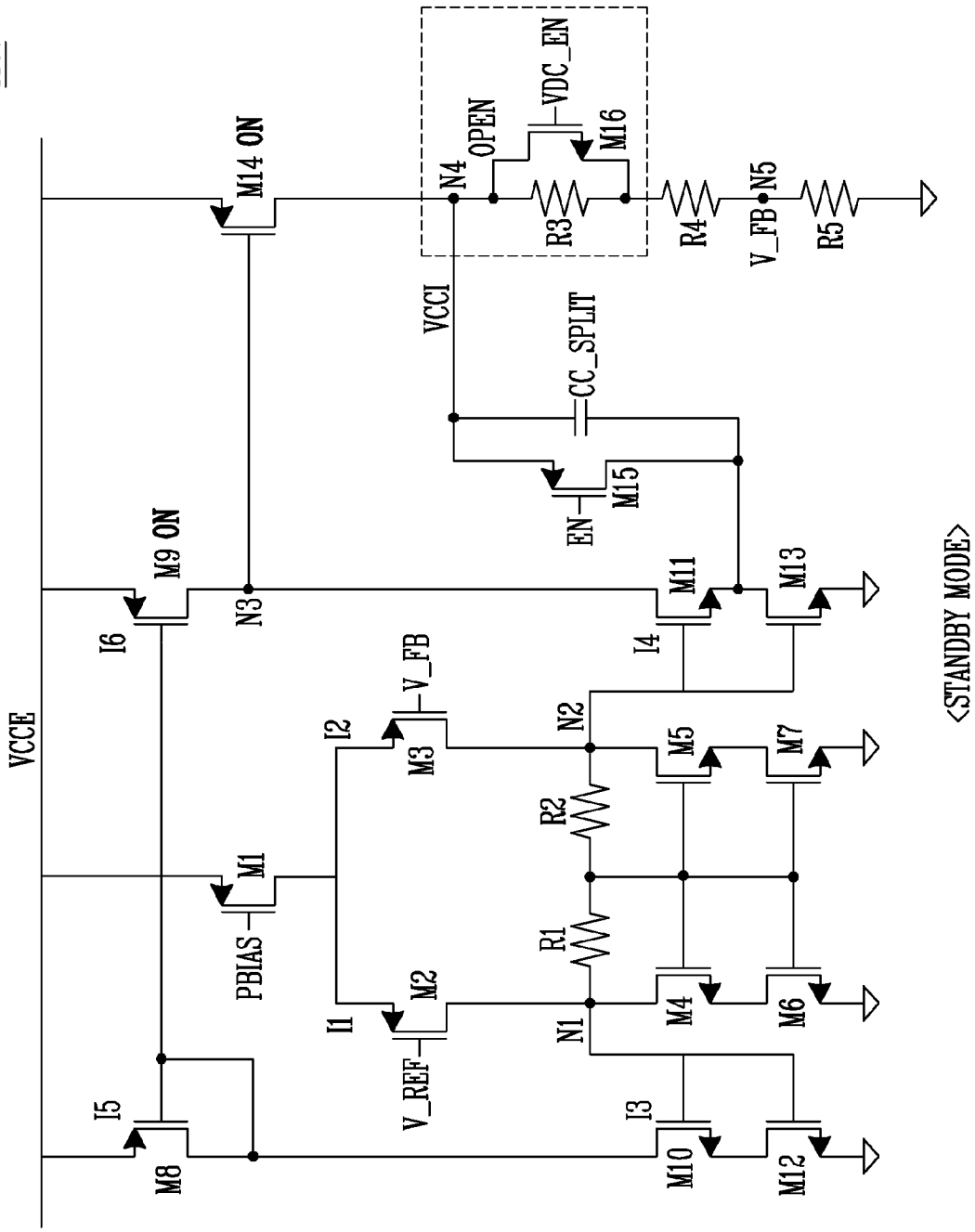
FIG. 9 is a diagram illustrating an example of a specific operation process of a standby voltage regulator in a standby mode according to an embodiment of the present disclosure.

FIG. 9 is a diagram illustrating an example of a specific operation process of a standby voltage regulator in a standby mode according to an embodiment of the present disclosure.

Referring to FIG. 9, an example of a specific circuit diagram according to an embodiment of the present disclosure is shown.

When the signal generation circuit provides the standby mode enable signal of the high state and the active mode enable signal VDC_EN of the low state to the standby voltage regulator 1130, the standby voltage regulator may provide the operation voltage of the memory device in the standby mode.

A constant bias voltage PBIAS may be applied, and thus M1 may function as a current source for flowing a constant current. As described in detailed description of FIG. 8, the reference voltage input to M2 and the feedback voltage V_FB input to M3 may have the same value. Therefore, a current generated by M1 may flow through M2 and M3 as I1 and I2, respectively. Since the reference voltage V_REF and the feedback voltage V_FB have the same value, I1 and I2 may have the same value.

A source-gate voltage of M12 may be maintained at a constant value by the current I1. A current flowing through M8 may be I5. I5 may be copied by a current-mirror and may flow through M9 as it is. At this time, I5 and I6 may have the same value. Since power of M13 is also turned on, a voltage applied to N3 may have a specific voltage value. A voltage applied to N3 at this time may be a transistor operation voltage.

When power of M14 is turned on due to a difference between VCCE which is the external input voltage and the operation voltage, a voltage applied to N4 may be the operation voltage of the memory device in the standby mode. That is, the voltage applied to N4 may mean a constant internal voltage provided in the standby mode. Since the active mode enable signal VDC_EN is in the low state, power of M16 may be in an off state. Therefore, a second internal voltage may be distributed according to resistance values of R3, R4, and R5 and applied to each resistor. Since power of M16 is in an off state, a resistance value might not be changed. In this case, the feedback voltage V_FB applied to N5 may be constant.

Figure 10:
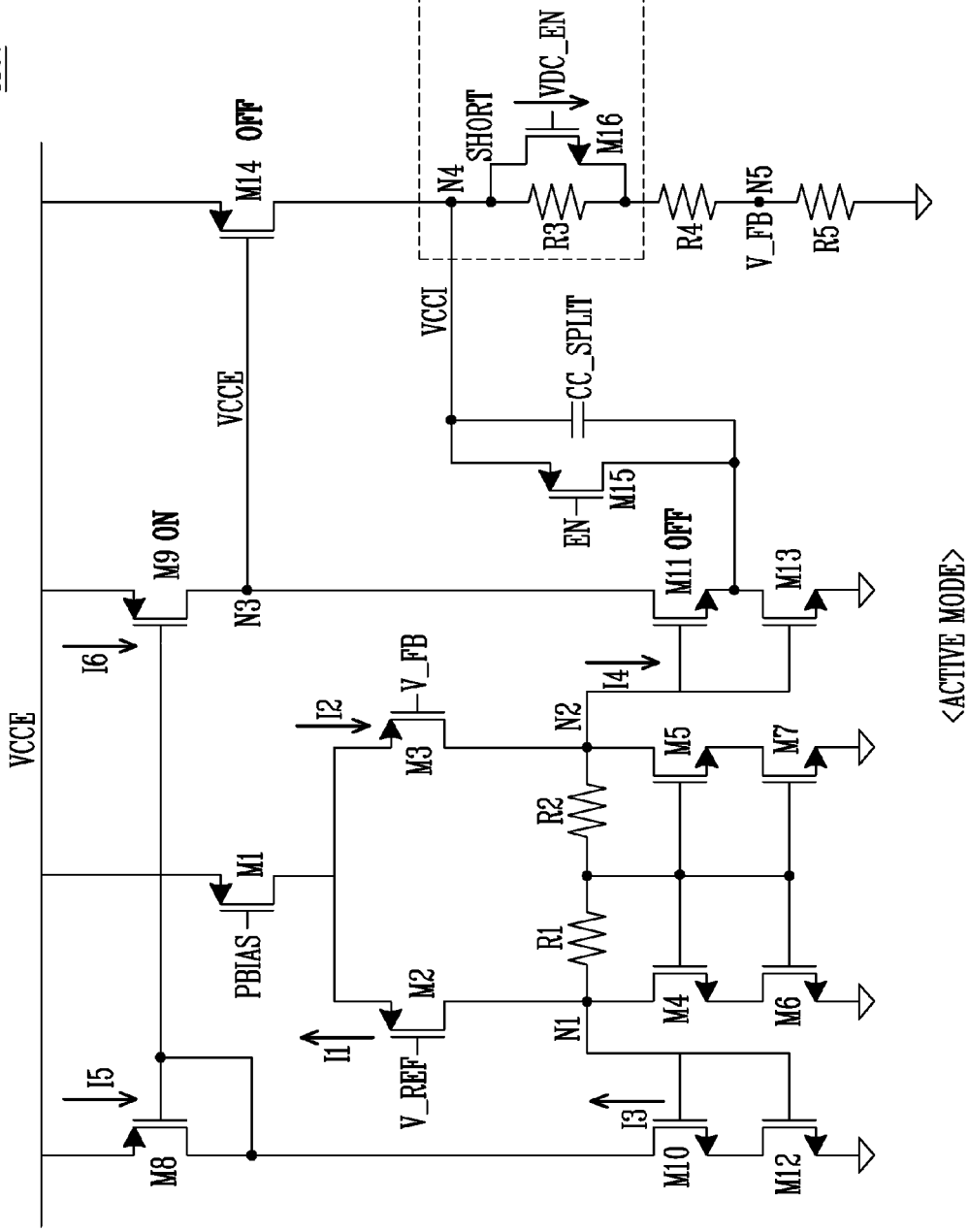
FIG. 10 is a diagram illustrating an example of a specific operation process of a standby voltage regulator in an active mode according to an embodiment of the present disclosure.

FIG. 10 is a diagram illustrating an example of a specific operation process of a standby voltage regulator in an active mode according to an embodiment of the present disclosure.

Referring to FIG. 10, an example of a specific circuit diagram according to an embodiment of the present disclosure is shown.

In the active mode, the signal generation circuit may provide each of the standby mode enable signal STB_EN of the high state and the active mode enable signal VDC_EN of the high state to the standby voltage regulator. In the active mode, the active voltage regulator may output a constant operation voltage of the memory device. The internal voltage output terminal of the active voltage regulator and the internal voltage output terminal of the standby voltage regulator may be connected to each other. Therefore, the voltage applied to the internal voltage output terminal of the standby voltage regulator may be the same as the operation voltage output by the active voltage regulator. A value of the active mode operation voltage may be maintained to be constant in the active mode.

When the active mode enable signal VDC_EN of the high state is input to M16, power of M16 may be turned on. The active mode enable signal VDC_EN of the high state may be a signal that controls M16 to operate. M16 may operate as a switch. That is, an internal resistance of M16 may have a resistance value less than that of R3. When the power of M16 is turned on, a current may flow from N4 to the ground terminal through M16. In the active mode, in a state in which the voltage applied to the internal voltage output terminal of the standby voltage regulator is constant as the operation voltage, the overall resistance value from the ground terminal to N4 may decrease due to the turn-on of the power of M16.

When the overall resistance decreases, a voltage drop-out less than a magnitude of a voltage drop-out occurring at R3 in standby mode may occur at M16. Since VCCI is constant as the operation voltage, a magnitude of a voltage applied to R4 and R5 may increase compared to that in the standby mode.

A magnitude of the feedback voltage V_FB, which is the voltage applied to N5, may increase compared to that in the standby mode, and the increased feedback voltage V_FB may be provided to the input voltage controller. That is, the adjusted feedback voltage V_FB may be input to a gate of M3. In this case, the reference voltage V_REF applied to a gate of M2 may have a constant value.

Similarly to a bias current shown in FIG. 9, M1 may function as a current source for supplying a constant current. That is, since a PBIAS voltage value is maintained to be constant, a value of the current flowing through M1 may also be constant. However, since while the reference voltage V_REF is constant, the feedback voltage V_FB is increased, a difference of a magnitude between the current I1 flowing through M2 and the current I2 flowing through M3 may occur. Since the feedback voltage V_FB has a value greater than the reference voltage V_REF, a source-gate voltage difference of M3 may be less than a source-gate voltage difference of M2. Due to a decreased source-gate voltage difference, I2 may be less than I1. That is, a sum of a current amount of I1 and I2 may be constant as a current amount flowing through M1, but I1 may have a value greater than I2.

As I1 increases, a current flowing through M6 may also increase. That is, a magnitude of a voltage applied to N1 may increase compared to that in the standby mode. When the magnitude of the voltage applied to N1 increases, a current amount flowing through M10 and M12 may also increase. That is, a current amount of a current I5 of M8 that descends downward as indicated by an arrow may increase. When the current amount of I5 increases, a current amount of a current I6 flowing through M9 may also increase by a current mirror. Even though the current amount of I6 increases as described above, a current amount of a current I4 flowing through M11 may be very small or might not flow. Therefore, all I6 may flow to a gate of M14. Through the process described above, a voltage applied to N3 may be the same voltage as the external input voltage VCCE.

That is, since a source voltage of M14 is the same as the external input voltage VCCE and a gate voltage of M14 is also the same as the external input voltage VCCE, a difference of a source-gate voltage might not occur. When the difference of source-gate voltage does not exist, since a transistor might not operate, power of M14 may be turned off. For convenience of description, it is assumed that a voltage applied to N3 is the same as the external input voltage VCCE, but a voltage capable of turning off the power of M14 may be applied to N3.

When the power of M14 is turned off, a voltage drop-out might not occur in M14, and the internal voltage output terminal of the standby voltage regulator might not be affected. Through the process described above, in an embodiment, an influence of the standby voltage regulator in the active mode may be eliminated.

Figure 11:
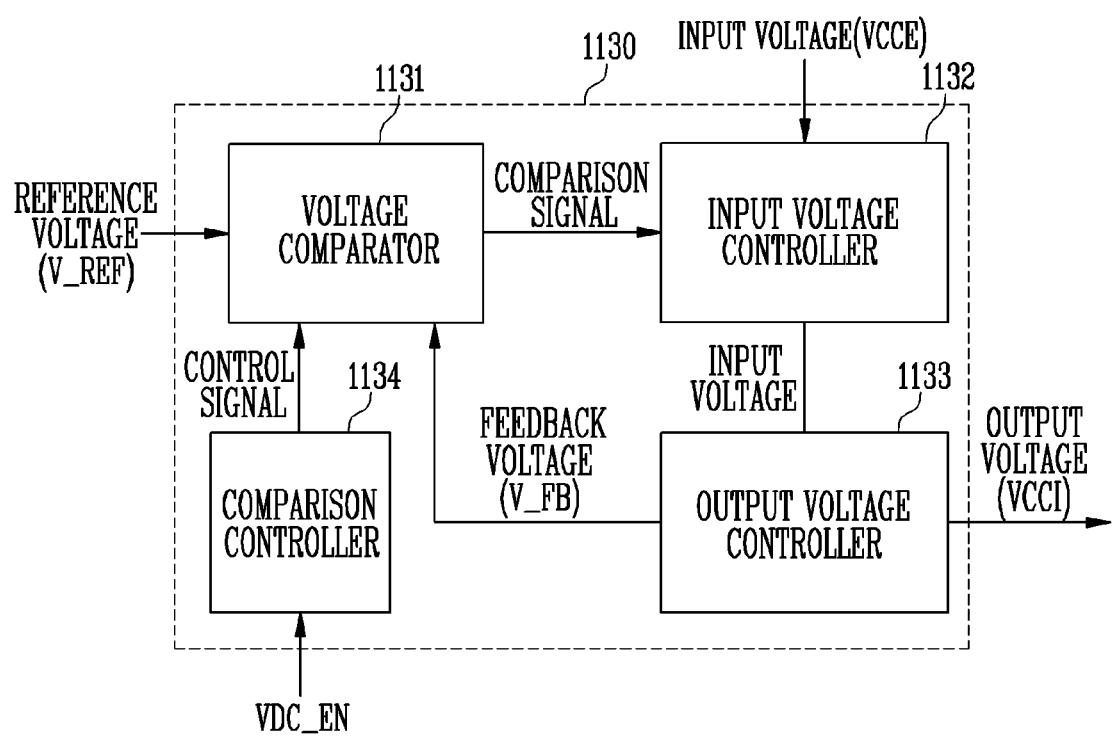
FIG. 11 is a diagram illustrating a structure of a standby voltage regulator according to another embodiment of the present disclosure.

FIG. 11 is a diagram illustrating a structure of a standby voltage regulator according to another embodiment of the present disclosure.

Referring to FIG. 11, a standby voltage regulator 1130 to which a comparison controller 1134 receiving the active mode enable signal VDC_EN is added is shown.

The voltage comparator 1131 may compare the reference voltage V_REF and the feedback voltage V_FB, and may provide the comparison signal to the input voltage controller 1132 according to the comparison result. When the feedback voltage V_FB is greater than the reference voltage V_REF, the voltage comparator 1131 may provide the comparison signal of the high state to the input voltage controller 1132. When the feedback voltage V_FB is less than or equal to the reference voltage V_REF, the voltage comparator 1131 may provide the comparison signal of the low state to the input voltage controller 1132. The comparison signal of the high state may be a signal for turning off the power of the input voltage controller 1132. The comparison signal of the low state may be a signal for turning on the power of the input voltage controller 1132. In addition, the comparison signal may be a voltage value provided according to design.

The power of the input voltage controller 1132 may be turned on or off based on the external input voltage VCCE and the comparison signal. That is, when the voltage comparator 1131 outputs the comparison signal of the high state in a state in which the external input voltage VCCE is applied, the power of the input voltage controller may be turned off. Conversely, when the voltage comparator 1131 outputs the comparison signal of the low state in a state in which the external input voltage VCCE is applied, the power of the input voltage controller 1132 may be turned on, and a difference between the external input voltage VCCE and a voltage drop-out across the input voltage controller 1132 may be provided to the output voltage controller 1133.

The output voltage controller 1133 may provide a standby mode operation voltage to be used in the standby mode. The standby mode operation voltage may be an internal voltage provided by the standby voltage regulator. The standby mode operation voltage may be a constant value in the standby mode. When the power of the input voltage controller 1132 is turned off, the connection between the output voltage controller 1133 and the input voltage controller 1132 may be disconnected. Even in this case, since the output terminal of the standby voltage regulator and the internal voltage output terminal of the active voltage regulator are connected, the active mode operation voltage may be applied to the internal voltage output terminal of the output voltage controller.

The comparison controller 1134 may control the voltage comparator 1131 in response to the active mode enable signal VDC_EN of the high state. When the active mode enable signal VDC_EN of the high state is input to the comparison controller 1134, the comparison controller 1134 may provide a control signal so that the voltage comparator 1131 outputs the comparison signal of the high state. Values of the reference voltage V_REF and the feedback voltage V_FB might not change while the voltage comparator 1131 outputs the comparison signal of the high state by the control signal of the comparison controller 1134.

The comparison controller 1134 may include a first transistor that receives the active mode enable signal VDC_EN through a gate terminal and a second transistor coupled to the first transistor in a cascode structure. A circuit diagram of the standby voltage regulator 1130 including the comparison controller 1134 is described with reference to FIG. 12.

Figure 12:
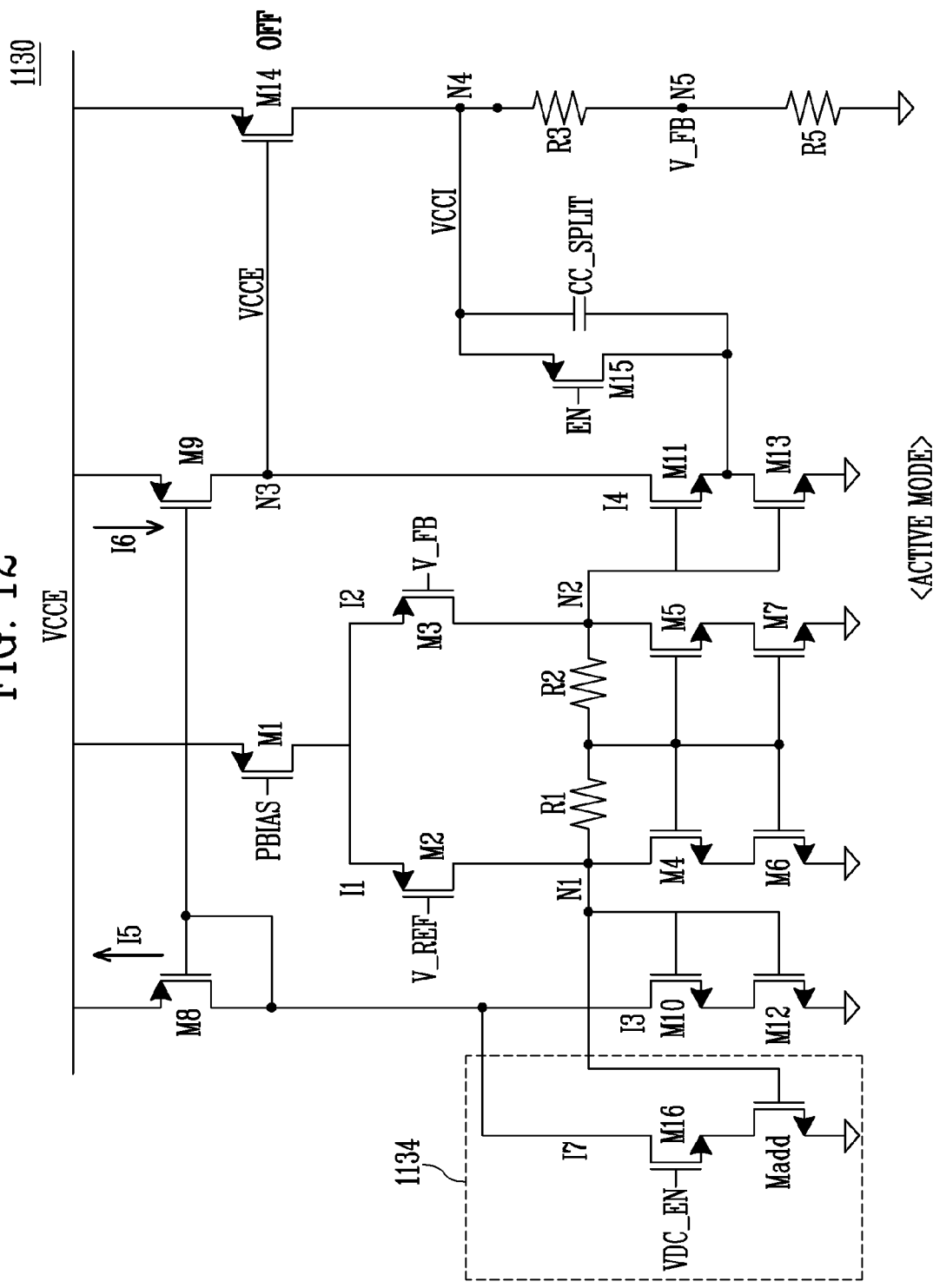
FIG. 12 is a diagram illustrating an operation process in another embodiment of the standby voltage regulator of FIG. 11.

FIG. 12 is a diagram illustrating an operation process in another embodiment of the standby voltage regulator of FIG. 11.

Referring to FIG. 12, a circuit diagram of the standby voltage regulator 1130 including the comparison controller 1134 is shown.

In the active mode in which the active mode enable signal VDC_EN of the high state and the standby mode enable signal STB_EN of the high state are applied, the current flowing through M1 may be constant. That is, since the PBIAS voltage applied to the gate of M1 is constant, M1 may function as a current source.

In the active mode, a voltage applied to N4 which is the terminal from which the internal voltage is output may be the first internal voltage provided by the active voltage regulator in the active mode. The first internal voltage may be maintained constant. Therefore, unless the first internal voltage is changed, the magnitude of the voltage applied to R3 and R5 might not be changed either. The feedback voltage V_FB, which is a voltage applied to N5, may also be maintained constant.

Since the reference voltage V_REF and the feedback voltage V_FB are maintained in a constant state, the currents I2 and I3 flowing through M2 and M3, respectively, may have the same current amount. In this situation, the active mode enable signal VDC_EN of the high state may be input to a gate of M16 of the comparison controller 1134. The active mode enable signal VDC_EN of the high state may be a signal for turning on the power of M16.

As the active mode enable signal VDC_EN of the high state is applied to the gate of M16, a current I7 may newly flow through M16 and Madd. Since the current I7 is required to newly flow, a current amount of the current I5 flowing through M8 may increase. As the current amount of I5 increases, a magnitude of I6 flowing downward may also increase by a current mirror. However, since the current amount of the current I4 flowing through M11 is small or the current I4 does not flow, all of the increased I6 may flow to the gate of M14. Therefore, a voltage applied to N3 may become equal to the external input voltage VCCE. When the voltage applied to N3 becomes equal to the external input voltage, a difference of a source-gate voltage of M14 might not occur. When a source voltage of M14 becomes equal to the external input voltage VCCE and a gate voltage becomes equal to the external input voltage VCCE, the power of M14 may be turned off. For convenience of description, it is assumed that the voltage applied to N3 is equal to the external input voltage VCCE, but a voltage that turns off the power of M14 may be applied to N3. As the power of M14 is turned off, an influence of the standby voltage regulator in active mode may be eliminated.

The comparison controller 1134 may include an N-MOS transistor having a gate terminal connected to an output terminal of the active mode enable signal VDC_EN, a drain terminal connected between a drain terminal of M8 and a drain terminal of M10, and a source terminal connected to a drain terminal of Madd. The comparison controller 1134 may include Madd, which is an N-MOS transistor having a drain terminal connected to a source terminal of M16, a gate terminal connected to gate terminals of M10 and M12, and a source terminal connected to the ground terminal. M16 and Madd may be configured in a cascode structure.

The comparison controller 1134 may control the voltage comparator by controlling a current amount flowing through the voltage comparator. Therefore, the comparison controller 1134 may be connected to another node of a voltage comparator by the same principle. For example, in response to the active mode enable signal VDC_EN of the high state, I1 may be increased as a current increase amount flowing through M16 and Madd flows through M2. I5 may be increased by the increased I1, and I6 may also be increased by the increased I5. Therefore, the power of M14 may be turned off identically. Similarly, in response to the active mode enable signal VDC_EN of the high state, I5 may be increased as the current increase amount flowing through M16 and Madd flows directly through M8. I6 may be increased by the increased I5, and the power of M14 may be turned off identically. Similarly, in response to the active mode enable signal VDC_EN of the high state, a current amount of I6 may be increased as the current increase amount flowing through M16 and Madd flows directly through M9. Similarly, the power of M14 may be turned off.

For convenience of description, an embodiment in which a drain terminal of M16 of the comparison controller 1134 is connected between M8 and M10 and a gate terminal of Madd is coupled to N1 is described as an example, but the comparison controller 1134 may be coupled to M2, M8, and M9 to perform the same operation.

Figure 13:
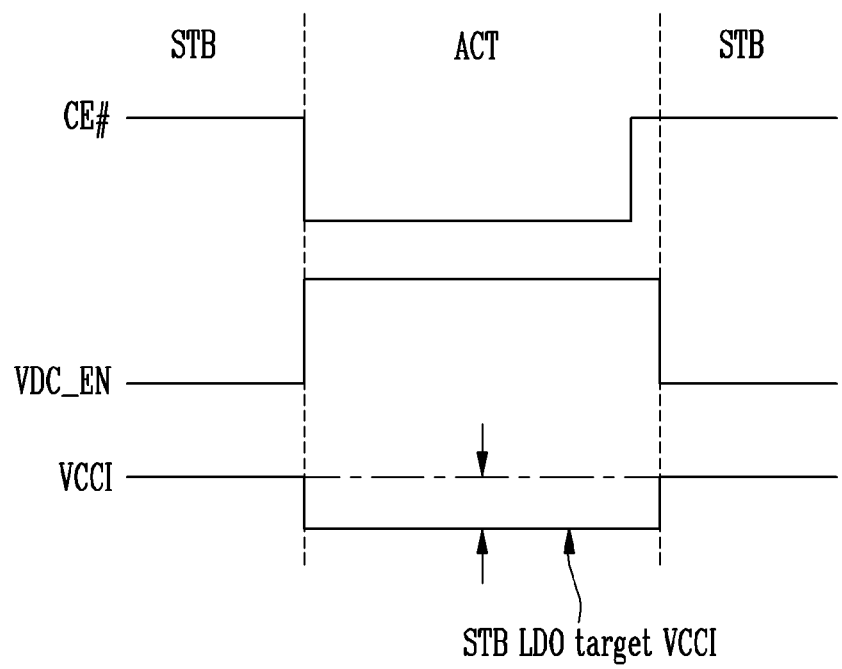
FIG. 13 is a graph illustrating a decrease of a voltage level of a standby voltage regulator according to an embodiment of the present disclosure.

FIG. 13 is a graph illustrating a decrease of a voltage level of a standby voltage regulator according to an embodiment of the present disclosure.

Referring to FIG. 13, FIG. 13 is a graph illustrating a relationship between internal voltages output in an active mode according to an embodiment of the present disclosure.

In a case where the chip selection signal according to chip enable line CE #is in the low state, the case may mean that the memory device is selected. Based on the chip selection signal according to chip enable line CE #of the low state and the active mode enable signal VDC_EN of the high state, the standby voltage regulator may operate without affecting an operation of the active voltage regulator. That is, a target voltage targeted by the standby voltage regulator may decrease only in an active mode period. Since the operation of the active voltage regulator is not affected in the active mode period, the target voltage targeted by the standby voltage regulator may be reduced only in the active mode period. Through this, in an embodiment, a problem according to a slow response speed of the standby voltage regulator may be resolved.

What is claimed is:

1. A voltage supply circuit comprising:
    a signal generation circuit configured to generate an active mode enable signal according to a chip selection signal provided from an external device, and generate a standby mode enable signal using an external voltage provided from the external device;
    an active voltage regulator configured to receive the active mode enable signal and output an active mode operation voltage when the active mode enable signal is in a high state; and
    a standby voltage regulator configured to receive the active mode enable signal and the standby mode enable signal, and output a voltage lower than a standby mode operation voltage outputted while the standby mode enable signal is in the high state, when the active mode enable signal is in the high state.

2. The voltage supply circuit of claim 1, wherein the standby voltage regulator generates the standby mode operation voltage using the external voltage when the standby mode enable signal is in the high state.

3. The voltage supply circuit of claim 1, wherein the standby voltage regulator comprises:
an operational amplifier configured to output a comparison signal to an output terminal according to a comparison result of a reference voltage input through a non-inverting terminal and a feedback voltage input through an inverting terminal;
a first transistor connected between the output terminal, an external voltage terminal from which the external voltage is applied, and a first node which is a terminal from which the standby mode operation voltage is output;
a first resistor and a second resistor connected between the first node and a second node which is a terminal from which the feedback voltage is applied;
a third resistor connected between the second node and a ground voltage terminal; and
a second transistor connected with the first resistor in parallel.

4. The voltage supply circuit of claim 1, wherein an output terminal of the active voltage regulator from which the active mode operation voltage is output and an output terminal of the standby voltage regulator from which the standby mode operation voltage is output are connected to each other.

5. The voltage supply circuit of claim 4, wherein a voltage of the output terminal of the standby voltage regulator is the active mode operation voltage in an active mode in which the active mode enable signal is in the high state.

6. The voltage supply circuit of claim 3, wherein the operational amplifier outputs the comparison signal of a high state for turning off power of the first transistor when the feedback voltage is greater than the reference voltage, and outputs the comparison signal of a low state for turning on the power of the first transistor when the feedback voltage is less than or equal to the reference voltage.

7. The voltage supply circuit of claim 3, wherein the first resistor has a resistance value higher than an internal resistance of the second transistor.

8. The voltage supply circuit of claim 7, wherein the second transistor receives the active mode enable signal of the high state through a gate terminal and operates in response to the active mode enable signal of the high state.

9. The voltage supply circuit of claim 8, wherein in the standby voltage regulator, when the second transistor operates, the feedback voltage which is a voltage of the second node increases, the operational amplifier outputs the comparison signal of the high state, and the power of the first transistor is turned off by receiving the comparison signal of the high state.

10. The voltage supply circuit of claim 3, wherein the first transistor is a p-channel metal-oxide semiconductor (P-MOS) transistor having a gate terminal connected to the output terminal, a source terminal connected to the external voltage terminal, and a drain terminal connected to the first node.

11. The voltage supply circuit of claim 3, wherein the second transistor is an n-channel metal-oxide semiconductor (N-MOS) transistor having a drain terminal connected to the first node, a source terminal connected to the second node, and a gate terminal connected to a terminal to which the active mode enable signal is output.

12. The voltage supply circuit of claim 1, wherein the signal generation circuit outputs the standby mode enable signal of the high state in a period except for a power-up or power-down period of the external voltage.

13. The voltage supply circuit of claim 12, wherein the signal generation circuit outputs the active mode enable signal of the high state in response to the period except for the power-up or power-down period, an inverted ready/busy signal generated while a memory device operates, or a test mode signal generated in a test mode of the memory device.

14. A memory device comprising:
memory cells;
a voltage supply circuit comprising;
a signal generation circuit configured to generate an active mode enable signal according to a chip selection signal provided from an external device, and generate a standby mode enable signal according to an external voltage provided from the external device;
an active voltage regulator configured to receive the active mode enable signal and output an active mode operation voltage of the memory cells in an active mode in which the active mode enable signal is in a high state; and
a standby voltage regulator configured to receive the active mode enable signal and the standby mode enable signal, and output a voltage lower than a standby mode operation voltage of the memory cells outputted while the standby mode enable signal is in the high state when the active mode enable signal is in the high state, and having an output terminal connected to an output terminal of the active voltage regulator to receive the active mode operation voltage of the memory cells through the output terminal; and
control logic configured to control the voltage supply circuit.

* * * * *